US009748079B2

United States Patent
Ohto et al.

(10) Patent No.: US 9,748,079 B2
(45) Date of Patent: Aug. 29, 2017

(54) CYLINDRICAL SPUTTERING TARGET MATERIAL

(71) Applicant: MITSUBISHI MATERIALS CORPORATION, Tokyo (JP)

(72) Inventors: Michiaki Ohto, Osaka (JP); Satoshi Kumagai, Osaka (JP); Akira Sakurai, Osaka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/913,028

(22) PCT Filed: Feb. 20, 2015

(86) PCT No.: PCT/JP2015/054770
§ 371 (c)(1),
(2) Date: Feb. 19, 2016

(87) PCT Pub. No.: WO2015/162986
PCT Pub. Date: Oct. 29, 2015

(65) Prior Publication Data
US 2016/0203959 A1 Jul. 14, 2016

(30) Foreign Application Priority Data
Apr. 22, 2014 (JP) ................................. 2014-088186

(51) Int. Cl.
*H01J 37/34* (2006.01)
*C23C 14/34* (2006.01)
(Continued)

(52) U.S. Cl.
CPC ............ *H01J 37/3426* (2013.01); *C22C 9/00* (2013.01); *C23C 14/34* (2013.01);
(Continued)

(58) Field of Classification Search
CPC .............. H01J 37/3423; H01J 37/3429; H01J 37/3426; C23C 14/3407; C23C 14/341;
(Continued)

(56) References Cited

U.S. PATENT DOCUMENTS 6,139,701 A 10/2000 Pavate et al.
2004/0238356 A1 12/2004 Matsuzaki et al.
(Continued)

FOREIGN PATENT DOCUMENTS

CN 1545569 A 11/2004
CN 102994962 A 3/2013
(Continued)

OTHER PUBLICATIONS

Office Action mailed Feb. 2, 2016 for the corresponding Korean Patent Application No. 10-2015-7033056.
(Continued)

*Primary Examiner* — Michael Band
(74) *Attorney, Agent, or Firm* — Leason Ellis LLP

(57) ABSTRACT

Provided is a cylindrical sputtering target material formed of copper or a copper alloy, in which an average value of the special grain boundary length ratios $L\sigma_N/L_N$ which are measured with respect to the outer peripheral surfaces of both end portions and the outer peripheral surface of the center portion in an axis O direction is set to be equal to or greater than 0.5, and each measured value is in a range of ±20% with respect to the average value of the special grain boundary length ratios $L\sigma_N/L_N$, and the total amount of Si and C which are impurity elements is equal to or smaller than 10 mass ppm and the amount of O is equal to or smaller than 50 mass ppm.

6 Claims, 3 Drawing Sheets

(51) Int. Cl.
| | |
|---|---|
| C22C 9/00 | (2006.01) |
| C22C 30/02 | (2006.01) |
| C22C 9/01 | (2006.01) |
| C22C 9/02 | (2006.01) |
| C22C 9/04 | (2006.01) |
| C22C 9/05 | (2006.01) |
| C22C 9/06 | (2006.01) |
| C22F 1/00 | (2006.01) |
| C22C 1/08 | (2006.01) |
| H01L 21/28 | (2006.01) |
| H01L 21/285 | (2006.01) |
| C22F 1/08 | (2006.01) |

(52) U.S. Cl.
CPC ...... *C23C 14/3414* (2013.01); *H01J 37/3423* (2013.01); *H01L 21/28* (2013.01); *H01L 21/285* (2013.01); *C22C 9/01* (2013.01); *C22C 9/02* (2013.01); *C22C 9/04* (2013.01); *C22C 9/05* (2013.01); *C22C 9/06* (2013.01); *C22F 1/00* (2013.01); *C22F 1/08* (2013.01)

(58) Field of Classification Search
CPC ......... C22C 1/0425; C22C 9/00; C22C 30/02; C22F 1/08; C22F 1/057
See application file for complete search history.

(56) References Cited

U.S. PATENT DOCUMENTS

| | | |
|---|---|---|
| 2010/0013096 A1 | 1/2010 | Irumata et al. |
| 2010/0219070 A1 | 9/2010 | Okabe |
| 2011/0303535 A1 | 12/2011 | Miller et al. |
| 2014/0087606 A1 | 3/2014 | Maki et al. |

FOREIGN PATENT DOCUMENTS

| | | | |
|---|---|---|---|
| CN | 103348036 A | 10/2013 | |
| JP | 05-311424 A | 11/1993 | |
| JP | 2005-330591 A | 12/2005 | |
| JP | 2012-111994 A | 6/2012 | |
| JP | 4974198 B | 7/2012 | |
| JP | 2013-057112 A | 3/2013 | |
| JP | WO 2013103149 A1 * | 7/2013 | .............. C22C 9/04 |
| KR | 10-2013-0128465 | 11/2013 | |
| WO | WO-2015/004958 A | 1/2015 | |

OTHER PUBLICATIONS

Notice of Allowance mailed Feb. 16, 2016 for the corresponding Taiwanese Patent Application No. 104105832.
Kronberg et al., "Secondary Recrystallization in Copper", *Metals Transactions*, Aug. 1949, pp. 501-514, vol. 185.
Brandon, "The Structure of High-Angle Grain Boundaries" *ACTA Metallurgica*, Nov. 1966, pp. 1479-1484, vol. 14.
International Search Report mailed Apr. 7, 2015 for the corresponding PCT Application No. PCT/JP2015/054770.
Office Action mailed May 30, 2016 for the corresponding Chinese Patent Application No. 201580000747.X.
Office Action mailed Oct. 7, 2016 for the corresponding German Patent Application No. 112015000125.5.
Office Action dated Jun. 1, 2017 for the corresponding Korean Patent Application No. 10-2016-7017496.

* cited by examiner

CYLINDRICAL SPUTTERING TARGET MATERIAL

CROSS-REFERENCE TO RELATED PATENT APPLICATIONS

This application is a U.S. National Phase Application under 35 U.S.C. §371 of International Patent Application No. PCT/JP2015/054770, filed Feb. 20, 2015, and claims the benefit of Japanese Patent Application No. 2014-088186, filed Apr. 22, 2014, all of which are incorporated by reference in their entireties herein. The International Application was published in Japanese on Oct. 29, 2015 as International Publication No. WO/2015/162986 under PCT Article 21(2).

FIELD OF THE INVENTION

The present invention relates to a cylindrical sputtering target material which is a material for a cylindrical sputtering target used for sputtering of a thin film formed of copper or a copper alloy.

BACKGROUND OF THE INVENTION

In the related art, Al or an Al alloy is widely used as a wiring film such as a flat panel display such as a liquid crystal or an organic EL panel, or a touch panel. In recent years, it has been required that the wiring film is miniaturized (has a narrow width) and has a small thickness, and a wiring film having a lower specific resistance than the wiring film in the related art is desired.

Therefore, a wiring film using copper or a copper alloy which is a material having a lower specific resistance than Al or an Al alloy is provided in order to meet the demand for miniaturization and a small thickness of the wiring film as described above.

A sputtering method using a sputtering target is generally used when forming such a wiring film (thin film) of copper or a copper alloy on a substrate.

As the sputtering target described above, a flat sputtering target disclosed in PTL 1 or a cylindrical sputtering target disclosed in PTL 2 has been proposed.

Herein, in the cylindrical sputtering target, an outer peripheral surface thereof is a sputtering surface and the sputtering is performed while rotating the target. Accordingly, sputtering using the cylindrical sputtering target is more suitable for continuous film formation as compared to using a flat sputtering target and excellent efficiency in use of the target is obtained.

CITATION LIST

Patent Documents

[PTL 1] Japanese Patent No. 4974198
[PTL 2] Japanese Unexamined Patent Application, First Publication No. 2012-111994

Technical Problem

However, when forming a film using a sputtering target, an abnormal electrical discharge (arcing) may occur due to foreign materials in the sputtering target, and accordingly, it is difficult to form a uniform wiring film. Herein, the abnormal electrical discharge is a phenomenon in which a current which is extremely higher compared to normal sputtering rapidly flows and an abnormally high electrical discharge rapidly occurs. When such an abnormal electrical discharge occurs, this may cause generation of particles or a non-uniform thickness of a wiring film. Therefore, it is desirable that the abnormal electrical discharge at the time of the film formation is avoided as possible.

The invention is made in consideration of these circumstances and an object thereof is to provide a cylindrical sputtering target material which is formed of copper or a copper alloy and can perform stable film formation by preventing an occurrence of an abnormal electrical discharge.

SUMMARY OF THE INVENTION

Solution to Problem

In order to solve the problems described above, according to an aspect of the invention, there is provided a cylindrical sputtering target material formed of copper or a copper alloy, in which, when special grain boundary length ratios $L\sigma_N/L_N$ are defined by a unit total grain boundary length $L_N$ which is obtained by measuring a total grain boundary length L of crystal grain boundaries in a measurement range and converting the total grain boundary length L into a value per unit area of 1 mm$^2$ and a unit total special grain boundary length $L\sigma_N$ which is obtained by measuring a total special grain boundary length $L\sigma$ of special grain boundaries in a measurement range and converting the total special grain boundary length $L\sigma$ into a value per unit area of 1 mm$^2$ by an EBSD method, the average value of the special grain boundary length ratios $L\sigma_N/L_N$ which are measured with respect to the outer peripheral surfaces of both end portions and the outer peripheral surface of the center portion in an axis direction is set to be equal to or greater than 0.5, and each value of special grain boundary length ratios $L\sigma_N/L_N$ measured with respect to the outer peripheral surfaces of both end portions and the outer peripheral surface of the center portion in an axis direction is in a range of ±20% with respect to the average value, and the total amount of Si and C which are impurity elements is equal to or smaller than 10 mass ppm and the amount of O is equal to or smaller than 50 mass ppm.

According to the cylindrical sputtering target material of the invention configured as described above, the average value of the special grain boundary length ratios $L\sigma_N/L_N$ of a crystal structure of an outer peripheral surface is equal to or greater than 0.5, and each value of the special grain boundary length ratios $L\sigma_N/L_N$ measured with respect to the outer peripheral surfaces of both end portions and the outer peripheral surface of the center portion in an axis direction is in a range of ±20% with respect to the average value. Accordingly, consistency of the crystal grain boundaries is improved in the outer peripheral surface which is a sputtering surface, the entire sputtering surface is uniformly sputtered, and thereby, it is possible to prevent the occurrence of an abnormal electrical discharge, even when sputtering is performed at high power.

According to the cylindrical sputtering target material according to the invention, the total amount of Si and C which are impurity elements is equal to or smaller than 10 mass ppm and the amount of O is equal to or smaller than 50 mass ppm. Therefore, it is possible to prevent an abnormal electrical discharge caused by the impurities.

In the cylindrical sputtering target material according to the aspect of the invention, it is preferable that an average crystal grain diameter of a crystal structure of the outer peripheral surface is in a range of 10 μm to 150 μm.

In this case, the average crystal grain diameter of the outer peripheral surface is set to be comparatively small, from 10 μm to 150 μm, and accordingly, it is possible to stably perform the sputtering with the small crystal grain diameter of the sputtering surface and to prevent the occurrence of an abnormal electrical discharge.

In the cylindrical sputtering target material according to the aspect of the invention, it is preferable that a proportion of an area of crystal grains having a crystal grain diameter which is more than double the average crystal grain diameter of the crystal structure of the outer peripheral surface is less than 20% of the entire crystal area.

In this case, since the crystal grain diameter of the outer peripheral surface which is a sputtering surface is set to be uniform, and accordingly, the sputtering is uniformly performed over the entire sputtering surface and it is possible to reliably prevent the occurrence of an abnormal electrical discharge.

Advantageous Effects of Invention

According to the invention, it is possible to provide a cylindrical sputtering target material which is formed of copper or a copper alloy and can stably form a film by preventing occurrence of an abnormal electrical discharge.

BRIEF DESCRIPTION OF THE DRAWINGS

FIG. 1(a) is a sectional view orthogonal to an axis direction and FIG. 1(b) is a side view.

DETAILED DESCRIPTION OF THE INVENTION

Hereinafter, a cylindrical sputtering target material according to the embodiment of the invention will be described with reference to the accompanied drawings.

A cylindrical sputtering target material 10 according to the embodiment is a material of a cylindrical sputtering target used when forming a thin film (wiring film) formed of copper or a copper alloy on a glass substrate or the like by performing sputtering.

Figure 1:
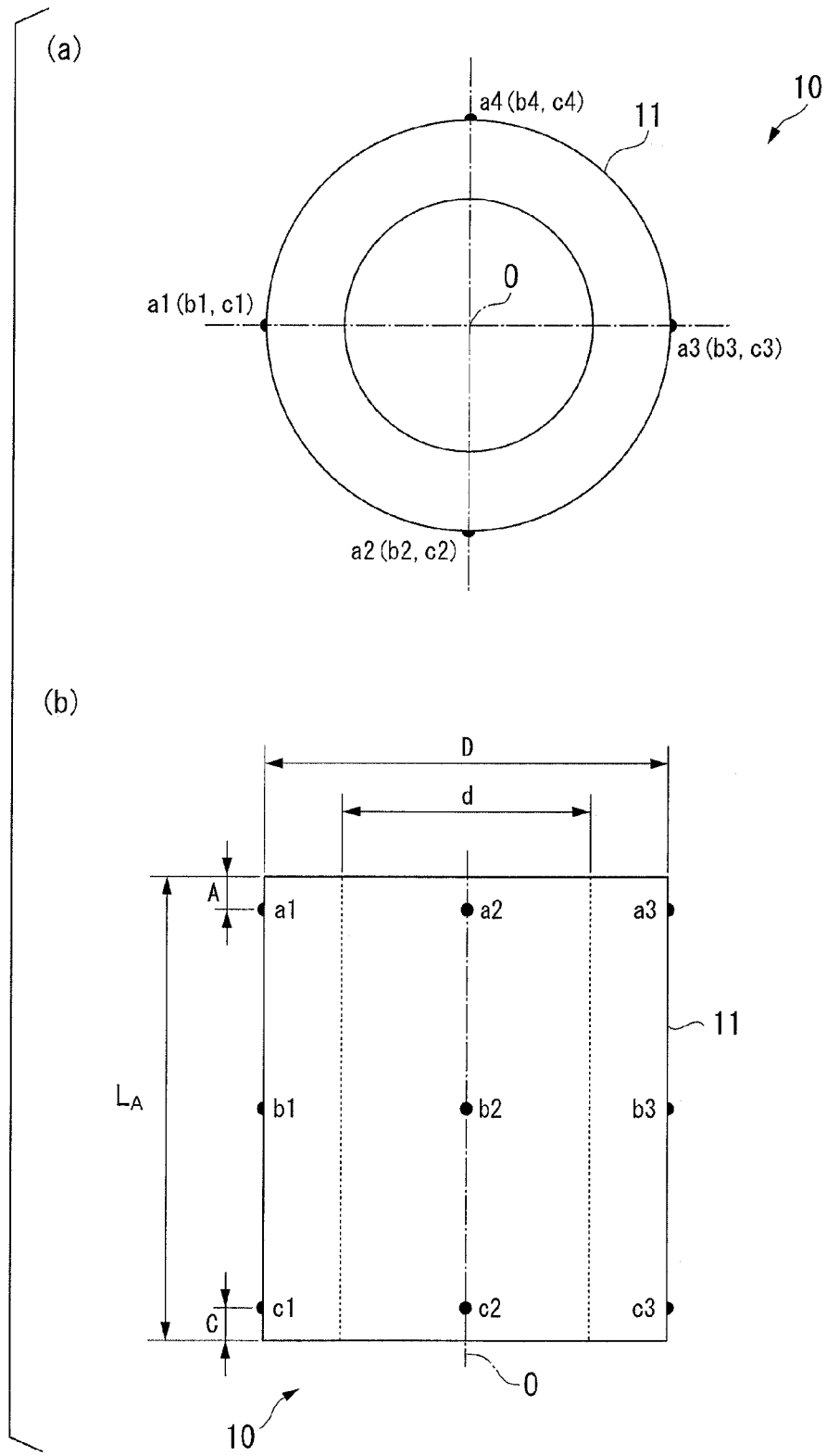
FIG. 1 is a schematic explanatory diagram of a cylindrical sputtering target material according to an embodiment of the invention.

As shown in FIG. 1, the cylindrical sputtering target material 10 has a cylindrical shape, an outer diameter D thereof is in a range satisfying a relationship of 140 mm ≤D≤180 mm, an inner diameter d thereof is in a range satisfying a relationship of 110 mm ≤d ≤135 mm, and a length $L_A$ thereof in an axis direction is in a range satisfying a relationship of 1000 mm ≤$L_A$ ≤4000 mm, for example.

Herein, an outer peripheral surface 11 of the cylindrical sputtering target material 10 is a sputtering surface of a cylindrical sputtering target.

The cylindrical sputtering target material 10 is configured with copper or a copper alloy having a composition according to a thin film to be formed of copper or a copper alloy.

In addition, in the cylindrical sputtering target material 10 of the embodiment, the total amount of Si and C which are impurity elements is equal to or smaller than 10 mass ppm and the amount of O is equal to or smaller than 50 mass ppm.

Herein, the cylindrical sputtering target material 10 of the embodiment is configured with pure copper such as oxygen-free copper or a copper alloy containing one kind or two or more kinds selected from Mg, Al, Ag, Ti, Zr, Mn, Ca, Cr, Sn, Ni, Zn, Co, and P. When one kind or two or more kinds selected from Mg, Al, Ag, Ti, Zr, Mn, Ca, Cr, Sn, Ni, Zn, Co, and P are contained, the total amount thereof is desirably in a range of 0.001 mass % to 10 mass %. The lower limit value of the total amount of Si and C may be 0.01 mass ppm and a lower limit value of the amount of O may be 0.5 mass ppm. In addition, the total amount of Si and C is preferably from 0.01 mass ppm to 2 mass ppm and the amount of O is preferably from 0.5 mass ppm to 10 mass ppm, but there is no limitation thereon.

Various characteristics such as resistivity, heat resistance, corrosion resistance, and the like are required for the thin film (wiring film) described above, and various copper or copper alloys are applicable. Therefore, in the embodiment, as copper alloys configuring the cylindrical sputtering target material 10, a Cu-0.002 mass % to 2 mass % Mg alloy, a Cu-0.001 mass % to 10 mass % Al alloy, a Cu-0.001 mass % to 10 mass % Mn alloy, a Cu-0.05 mass % to 4 mass % Ca alloy, a Cu-0.01 mass % to 10 mass % Ag alloy, and the like are used, for example.

In the cylindrical sputtering target material 10 of the embodiment, regarding a crystal structure of the outer peripheral surface which is a sputtering surface, special grain boundary length ratios $L\sigma_N/L_N$ which are defined by a unit total grain boundary length $L_N$ which is obtained by measuring a total grain boundary length L of crystal grain boundaries in a measurement range and converting the total grain boundary length L into a value per unit area of 1 mm² and a unit total special grain boundary length $L\sigma_N$ which is obtained by measuring a total special grain boundary length Lσ of special grain boundaries in a measurement range and converting the total special grain boundary length Lσ into a value per unit area of 1 mm² by an EBSD method, are measured with respect to the outer peripheral surfaces of both end portions and the outer peripheral surface of the center portion in an axis O direction, and an average value of the measured special grain boundary length ratios $L\sigma_N/L_N$ is set to be equal to or greater than 0.5. An upper limit value of the average value of the special grain boundary length ratios $L\sigma_N/L_N$ may be 1.

Herein, an EBSD method means an electron backscatter diffraction patterns (EBSD) method performed using a scanning electron microscope provided with a back scattering electron diffraction image system. In addition, Orientation Imaging Microscopy (OIM) is data analysis software for analyzing crystal orientation using measurement data by the EBSD. Further, a CI value is a confidence index and is a numerical value shown as a numerical value representing reliability of determination of crystal orientation, when analysis is performed using analysis software OIM Analysis (Ver. 5.3) of an EBSD device (for example, "Textbook of EBSD: Introduction to the use of OIM (third revised edition)" written by Seiichi Suzuki, September 2009, published by TSL Solutions Ltd.).

In addition, the special grain boundary is a Σ value crystallographically defined based on the CSL theory (Kronberg et al.: Trans. Met. Soc. AIME, 185, 501 (1949)), is a corresponding grain boundary belonging to a range of 3≤Σ≤29, and is defined as a crystal grain boundary in which a unique corresponding part lattice orientation defect Dq of the corresponding grain boundary satisfies a relationship of Dq≤15°/$\Sigma^{1/2}$ (D. G. Brandon: Acta. Metallurgica. Vol. 14, p. 1479, (1966)).

Further, as a result of observation of a two-dimensional cross section, the crystal grain boundaries are defined as boundaries between the crystals when an orientation direction difference between two adjacent crystals is equal to or greater than 15°.

In the cylindrical sputtering target material 10 of the embodiment, each value of special grain boundary length ratios $L\sigma_N/L_N$ measured with respect to the outer peripheral surfaces of both end portions and the outer peripheral surface of the center portion in an axis O direction is in a range of ±20% with respect to the measured average value of the special grain boundary length ratios $L\sigma_N/L_N$. It is preferable that the each value of special grain boundary length ratios $L\sigma_N/L_N$ measured with respect to the outer peripheral surfaces of both end portions and the outer peripheral surface of the center portion in an axis O direction is in a range of ±10% with respect to the measured average value of the special grain boundary length ratios $L\sigma_N/L_N$, but there is no limitation thereon.

In the embodiment, as shown in FIG. 1, special grain boundary length ratios $L\sigma_N/L_N$ of 12 points including 4 points (a1, a2, a3, and a4) which are in positions located from an edge surface of one side (upper edge surface of FIG. 1(*b*)) of the cylindrical sputtering target material 10 in the axis O direction by a distance of A=20 mm at intervals of 90° in a circumferential direction, 4 points (b1, b2, b3, and b4) which are in positions of the center portion in the axis O direction at intervals of 90° in a circumferential direction, and 4 points (c1, c2, c3, and c4) which are in positions located away from an edge surface of the other side (lower edge surface of FIG. 1(*b*)) in the axis O direction by a distance of C=20 mm and are also located at intervals of 90° in a circumferential direction are respectively measured.

In addition, in the cylindrical sputtering target material 10 of the embodiment, an average crystal grain diameter in the crystal structure of the outer peripheral surface is in a range of 10 µm to 150 µm.

Herein, the number of crystal grains particle in an observation area from the crystal grain boundaries specified by the EBSD method described above is calculated, the total length of the crystal grain boundaries in the observation area is divided by the number of crystal grains particle to calculate a crystal grain particle area, circle conversion of the crystal grain area is performed, and accordingly the average crystal grain diameter is acquired. The average crystal grain diameter is preferably from 20 µm to 100 µm, but there is no limitation thereon.

In addition, in the cylindrical sputtering target material 10 of the embodiment, in the crystal structure of the outer peripheral surface, a proportion of the area of the crystal grains having a crystal grain diameter which is more than double the average crystal grain diameter is less than 20% of the entire crystal area.

Herein, after calculating the average crystal grain diameter, crystal grains having a crystal grain diameter which is more than double the average crystal grain diameter are specified, the crystal grain diameter thereof is measured and the number thereof is counted, an area of the crystal grains having a crystal grain diameter which is more than double the average crystal grain diameter is calculated, crystal grain diameters of all of the observed crystal particles are measured and the number thereof is counted, to calculate the entire area, and accordingly, the proportion of the area of the crystal grains having a crystal grain diameter which is more than double the average crystal grain diameter is acquired. In addition, the lower limit value of the proportion of the area of the crystal grains having a crystal grain diameter which is more than double the average crystal grain diameter may be 5%. Further, the proportion of the area of the crystal grains having a crystal grain diameter which is more than double the average crystal grain diameter is preferably from 5% to 15%, but there is no limitation thereon.

Figure 2:
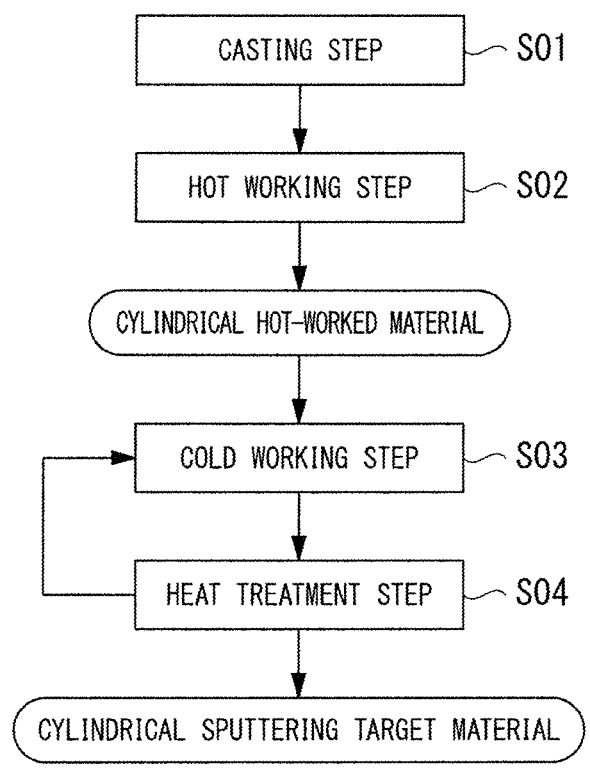
FIG. 2 is a flowchart showing an example of a manufacturing method of a cylindrical sputtering target material according to the embodiment of the invention.

Next, one embodiment of a manufacturing method of a cylindrical sputtering target material for manufacturing the cylindrical sputtering target material 10 having the configuration described above will be described with reference to a flowchart of FIG. 2.

In the embodiment, the method includes a casting Step S01 of casting an ingot, a hot working Step S02 of performing hot working for the ingot to manufacture a cylindrical hot-worked material, a cold working Step S03 of performing cold working for the obtained cylindrical hot-worked material, and a heat treatment Step S04 of performing a heat treatment for the cylindrical worked material subjected to the cold working Step S03. In the embodiment, the cold working Step S03 and the heat treatment Step S04 are repeatedly performed, and in the cold working Step S03, the cold working is performed for the cylindrical hot-worked material and the cylindrical worked material obtained from the cylindrical hot-worked material subjected to the cold working and the heat treatment.

In the casting Step S01, a columnar ingot is continuously manufactured using various casting machines such as a vertical continuous casting machine, a horizontal continuous casting machine, and a semi-continuous casting machine, and is cut to have a predetermined length.

Herein, in the casting step S01, melting and casting are performed using electrolytic copper having an amount of Si which is smaller than 10 mass ppm and an amount of C which is smaller than 5 mass ppm, at a temperature equal to or lower than 1200° C. which is a temperature at which Si is not eluted from a furnace material, so that the total amount of Si and C which are impurity elements is equal to or smaller than 10 mass ppm. An alumina-based fireproof material is used for a member having a portion to be heated, so as to prevent mixing of Si, and a gutter is sealed in a non-oxidizing atmosphere such as Ar gas so that the amount of C does not increase. In addition, a deacidification treatment of molten copper is performed so that the amount of O becomes equal to or smaller than 50 mass ppm. Specifically, the atmosphere in the furnace at the time of preheating, melting, and maintaining melting raw materials such as electrolytic copper is controlled so that the amount of CO is from 0.5 vol % to 5.0 vol %, and the gutter through which molten copper passes is sealed in a non-oxidizing atmosphere. Accordingly, it is possible to manufacture an ingot having an amount of oxygen equal to or smaller than 50 mass ppm, in a state where the amount of oxygen is decreased to the limit when melting electrolytic copper, without increasing the amount of oxygen in subsequent steps. The addition of alloy elements is performed in the atmosphere which is controlled as described above.

In the hot working Step S02, the columnar ingot is heated to a temperature which is equal to or higher than a recrystallizing temperature to perform rolling or extrusion, and a cylindrical hot-worked material is manufactured. In the embodiment, the cylindrical hot-worked material is manufactured by hot extrusion. Herein, in the hot working Step S02, it is preferable that hot working conditions are set so that the average crystal grain diameter of the obtained cylindrical hot-worked material is equal to or smaller than 20 mm. Regarding the average crystal grain diameter of the cylindrical hot-worked material described above, it is preferable that a crystal structure of an outer peripheral surface which is a sputtering surface in the cylindrical sputtering target is set as a target. The lower limit value of the average crystal grain diameter of the cylindrical hot-worked material may be 0.01 mm. In addition, the average crystal grain diameter of the cylindrical hot-worked material is more preferably from 0.01 mm to 0.3 mm, but there is no limitation thereon.

In the cold working Step S03, cold working is performed for the cylindrical ingot (and the cylindrical worked material obtained from the cylindrical ingot subjected to the cold working and the heat treatment).

Herein, in the embodiment, as the cold working Step S03, a tube expansion step of expanding an outer diameter of the cylindrical ingot or the cylindrical worked material before performing the cold working is performed at least two times or more by drawing.

In the heat treatment Step S04, a heat treatment is performed for the cylindrical worked material which is subjected to the cold working. Heat treatment means are not particularly limited, but a batch type heat treatment furnace or continuous annealing furnace can be used. Herein, in the embodiment, the heat treatment Step S04 is performed using a batch type heat treatment furnace in heat treatment conditions in which a heat treatment temperature is from 400° C. to 900° C. and a maintaining time in a range of the heat treatment temperature is in a range of 15 minutes to 120 minutes.

Herein, in the embodiment, by repeatedly performing the cold working Step S03 and the heat treatment Step S04, conditions of the cold working Step S03 are set so that the total reduction of a degree of working regarding thickness is from 15% to 25%, the degree of expansion of the outer diameter is equal to or smaller than 30%, and the degree of expansion of the inner diameter is equal to or smaller than 20%.

The cylindrical sputtering target material 10 formed as described above is further subjected to working and is used as a cylindrical sputtering target material. Herein, the cylindrical sputtering target is used to be rotated around an axis in a sputtering device and an outer peripheral surface thereof is used as a sputtering surface.

According to the cylindrical sputtering target material 10 of the embodiment having the configuration described above, the total amount of Si and C which are impurity elements is equal to or smaller than 10 mass ppm and the amount of O is equal to or smaller than 50 mass ppm, and accordingly, it is possible to prevent an abnormal electrical discharge caused by the impurities.

In addition, according to the cylindrical sputtering target material 10 of the embodiment, the average value of the special grain boundary length ratios $L\sigma_N/L_N$ which are measured with respect to one side in the axis O direction (a1, a2, a3, and a4), the center portion in the axis O direction (b1, b2, b3, and b4), and the other side in the axis O direction (c1, c2, c3, and c4) in the crystal structure of the outer peripheral surface is set to be equal to or greater than 0.5, and the measurement values thereof are respectively in a range of ±20% with respect to the average value of the special grain boundary length ratios $L\sigma_N/L_N$. Consistency of the crystal grain boundaries is improved in the outer peripheral surface which is a sputtering surface, and the entire sputtering surface is uniformly sputtered, and accordingly, it is possible to prevent the occurrence of an abnormal electrical discharge, even when sputtering is performed under high output.

In addition, according to the cylindrical sputtering target material 10 of the embodiment, the average crystal grain diameter of the outer peripheral surface is in a range of 10 µm to 150 µm and the proportion of the area of the crystal grains having a crystal grain diameter which is more than double the average crystal grain diameter is less than 20% of the entire crystal area. Therefore, the crystal structure of the outer peripheral surface is uniformly miniaturized, it is possible to uniformly perform sputtering of the entire sputtering surface, and it is possible to reliably prevent occurrence of an abnormal electrical discharge.

In addition, according to the cylindrical sputtering target material 10 of the embodiment, a copper alloy containing one kind or two or more kinds selected from Mg, Al, Ag, Ti, Zr, Mn, Ca, Cr, Sn, Ni, Zn, Co, and P is used, and accordingly, it is possible to obtain the crystal sputtering target material 10 which can form a thin film having various excellent characteristics such as resistivity, heat resistance, corrosion resistance, and the like. In the copper alloy described above, it is desirable that the total amount of one kind or two or more kinds selected from Mg, Al, Ag, Ti, Zr, Mn, Ca, Cr, Sn, Ni, Zn, Co, and P is in a range of 0.001 mass % to 10 mass %.

In addition, in the embodiment, since the average crystal grain diameter of the outer peripheral surface of the cylindrical hot-worked material is set to be equal to or smaller than 20 µm, it is possible to obtain the cylindrical sputtering target material 10 in which the crystal structure of the outer peripheral surface is uniformly miniaturized, by repeatedly performing the cold working and the heat treatment for the cylindrical hot-worked material.

In the embodiment, by repeatedly performing the cold working Step S03 and the heat treatment Step S04, conditions of the cold working Step S03 are set so that the total reduction of a degree of working regarding thickness is from 15% to 25%, the degree of expansion of the outer diameter is equal to or smaller than 30%, and the degree of expansion of the inner diameter is equal to or smaller than 20%. Therefore, it is possible to apply uniform working over the entire periphery and it is possible to set respective values of the special grain boundary length ratios $L\sigma_N/L_N$ in a range of ±20% with respect to the average value of the entire measured special grain boundary length ratios $L\sigma_N/L_N$.

Hereinabove, the embodiments of the invention have been described, but the invention is not limited thereto, and the embodiments can be suitably changed within a range not departing from the technical ideas of the invention.

For example, in the embodiment, the conditions of the heat treatment Step S04 has been described as conditions in which the heat treatment temperature is from 400° C. to 900° C. and the maintaining time in a range of the heat treatment temperature is in a range of 15 minutes to 120 minutes, but there is no limitation thereon, and the heat treatment conditions may be suitably set according to a composition and a size of a cylindrical sputtering target material to be formed or a device which performs a heat treatment.

In addition, in the embodiment, pure copper such as oxygen-free copper or the copper alloy formed of a composition which contains one kind or two or more kinds selected from Mg, Al, Ag, Ti, Zr, Mn, Ca, Cr, Sn, Ni, Zn, Co, and P, and the balance of copper and inevitable impurities has been described as an example of the copper or the copper alloy configuring the cylindrical sputtering target material 10, but other copper or copper alloys may be targets.

Figure 3:
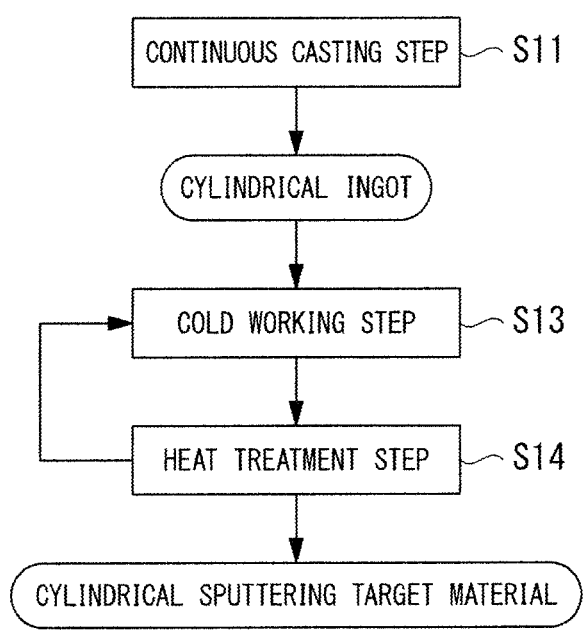
FIG. 3 is a flowchart showing another example of a manufacturing method of a cylindrical sputtering target material according to the embodiment of the invention.

Further, in the embodiment, a cylindrical hot-worked material has been described as a material manufactured in the hot working Step S02, but there is no limitation thereon. For example, as shown in a flowchart of FIG. 3, a cylindrical ingot may be manufactured in a continuous casting Step S11 using a continuous casting machine or a semi-continuous casting machine, and a cold working Step S13 of performing cold working and a heat treatment Step S14 of performing a heat treatment for a cylindrical worked material subjected to the cold working Step S13 may be repeatedly performed for the cylindrical ingot. In this case, in the continuous casting Step S11, the casting conditions are preferably set so that an average crystal grain diameter of the obtained cylindrical ingot is equal to or smaller than 20 mm. In addition, regarding the average crystal grain diameter of the cylindrical ingot, it is preferable that the crystal structure of an outer peripheral surface which is a sputtering surface in the cylindrical sputtering target is set as a target.

EXAMPLES

Hereinafter, results of a confirmation test performed for confirming the effectiveness of the invention will be described.

First, a columnar ingot formed of copper or a copper alloy having a composition shown in Table 1 was manufactured by a vertical continuous casting machine. At that time, the amounts of C, Si, and O which are impurities in molten copper were adjusted. Electrolytic copper in which the amount of Si is smaller than 10 mass ppm and the amount of C is smaller than 5 mass ppm was used as a raw material. In addition, in order to prevent mixing of Si at the time of melting and casting, a temperature at the time of melting and casting was set to be equal to or lower than 1200° C. which is a temperature at which Si is not eluted from a furnace material, and an alumina-based fireproof material was used for a member having a portion to be heated. In addition, in order to prevent an increase in the amount of C, the atmosphere in the furnace at the time of preheating, melting, and maintaining of melting raw materials such as electrolytic copper was controlled so that the amount of CO is from 0.5 vol % to 5.0 vol %, and the inside of the gutter was set as a non-oxidizing atmosphere or a reducing atmosphere.

The hot extrusion working was performed by heating this ingot to 800° C. and a cylindrical hot-worked material (outer diameter of 150 mm and inner diameter of 80 mm) was manufactured.

The drawing (1 to 10 passes) and the heat treatment (at 400° C. to 800° C. for 15 minutes to 120 minutes) were repeatedly performed in this order and correction working was performed for the obtained cylindrical hot-worked material, and a cylindrical sputtering target material having an outer diameter of 174 mm and an inner diameter of 118 mm was obtained.

A cylindrical sputtering target was manufactured using the cylindrical sputtering target material.

The following evaluations were performed with respect to the cylindrical sputtering target material and the cylindrical sputtering target described above.

<Analysis of Impurity Elements>

The amount of Si in the cylindrical sputtering target material was measured by solid emission spectrography using ARL-4460 manufactured by Thermo Fisher Scientific Inc.

The amount of C in the cylindrical sputtering target material was measured by a combustion-infrared absorption method using CSLS600 manufactured by LECO JAPAN CORPORATION.

The amount of O in the cylindrical sputtering target material was measured by an inert gas melting-infrared absorption method (JIS H 1067) using a RO-600 manufactured by LECO JAPAN CORPORATION.

<Special Grain Boundary Length Ratio of Cylindrical Sputtering Target Material>

Samples were extracted from 12 points including 4 points which are in positions separated from an edge surface of one side of the obtained cylindrical sputtering target material in the axis O direction by a distance of A=20 mm at intervals of 90° in a circumferential direction, 4 points which are in positions of the center portion in the axis O direction at intervals of 90° in a circumferential direction, and 4 points which are in positions separated from an edge surface of the other side in the axis O direction by a distance of C=20 mm at intervals of 90° in a circumferential direction, and the outer peripheral surface of the cylindrical sputtering target material was set as a measurement surface. After performing mechanical polishing of the measurement surface of each sample using waterproof abrasive paper and diamond abrasive grains, finishing polishing was performed using a colloidal silica solution.

The crystal grain boundaries and special grain boundaries were specified using an EBSD measurement device (S4300-SEM manufactured by Hitachi, Ltd. and OIM Data Collection manufactured by EDAX/TSL) and analysis software (OIM Data Analysis ver. 5.2 manufactured by EDAX/TSL), and analysis of the special grain boundary length ratios was performed by calculating lengths thereof.

First, using a scanning electron microscope, an electronic beam was emitted to each measurement point (pixel) in the measurement range of the sample surface, the sample surface was scanned with the electron beam two-dimensionally, and a portion between measurement points of which an orientation difference between adjacent measurement points is equal to or greater than 15° was set as a crystal grain boundary by orientation analysis performed by a backscattered electron beam analysis method.

In addition, the total grain boundary length L of the crystal grain boundaries in the measurement range was measured and the unit total grain boundary length $L_N$ obtained by converting total grain boundary length L into a value per unit area of 1 mm$^2$ was acquired. At the same time, the position of the crystal grain boundary in which the interface between the adjacent crystal grains configures the special grain boundary was determined to measure the total special grain boundary length $L\sigma$ of the special grain boundary, and the unit total special grain boundary length $L\sigma_N$ obtained by converting total special grain boundary length $L\sigma$ into a value per unit area of 1 mm$^2$ was acquired. In addition, the special grain boundary length ratios ($L\sigma_N/L_N$) between the unit total grain boundary length $L_N$ and the unit total special grain boundary length $L\sigma_N$ were calculated.

The average value was calculated from all of the measured special grain boundary length ratios $L\sigma_N/L_N$ and a value of maximum variation with respect to the average value of the values of the measured special grain boundary length ratios $L\sigma_N/L_N$ was evaluated.

<Average Crystal Grain Diameter of Cylindrical Sputtering Target Material>

The observation of the crystal structure of the outer peripheral surface of the obtained cylindrical sputtering target material was performed and the average crystal grain diameter was calculated.

Using measurement samples from the calculation of the special grain boundary length ratios, the crystal grain boundaries were specified by an EBSD measurement device (S4300-SE manufactured by Hitachi, Ltd. and OIM Data Collection manufactured by EDAX/TSL) using a field emission type scanning electron microscope and analysis software (OIM Data Analysis ver. 5.2 manufactured by EDAX/

TSL). The measurement conditions were set so that the measurement range was 680 μm×1020 μm, the measurement step was 2.0 μm, and the operation time was set as 20 msec/point.

Specifically, an electronic beam was emitted to each measurement point(pixel) in the measurement range of the sample surface using the scanning electron microscope described above, and the measurement points of which an orientation difference between adjacent measurement points is equal to or greater than 15° was set as a crystal grain boundary by orientation analysis performed by a backscattered electron beam analysis method. The number of crystal particles in the observation area was counted from the obtained crystal grain boundaries, the total length of the crystal grain boundaries in the observation area was divided by the number of crystal particles to calculate a crystal grain area, circle conversion of the crystal grain area was performed, and accordingly the average crystal grain diameter was acquired.

<Proportion of Area of Crystal Grains Having Crystal Grain Diameter which is More than Double Average Crystal Grain Diameter>

In addition, the crystal structure of the outer peripheral surface of the cylindrical sputtering target material was observed and the proportion of the area of the crystal grains having a crystal grain diameter which is more than double the average crystal grain diameter was calculated.

After calculating the average crystal grain diameter by the procedure described above, grain size distribution was acquired by the EBSD, the grain diameter which is equal to or greater than the average value was calculated, and the crystal grains having a crystal grain diameter which is more than double the average crystal grain diameter were specified. The crystal grain diameter of the specified crystal grains was calculated and the number thereof was counted to calculate the area of the crystal grains having a crystal grain diameter which is more than double the average crystal grain diameter. The proportion of the area of the crystal grains having a crystal grain which is more than double the average crystal grain diameter was acquired by calculating the entire area by measuring the crystal grain diameter of all of the observed crystal grains and counting the number thereof.

<Sputtering Test>

A sputtering test was performed under the following conditions using the obtained cylindrical sputtering target and the number of times of an abnormal electrical discharge was counted using an arcing counter attached to a sputtering device. The sputtering test was performed under two conditions of "Ar gas" used when forming a wiring film and "mixed gas" used when forming an oxygen-containing film as atmosphere gas.

Results of the evaluation are shown in Table 1.
Power: DC
Sputtering output: 600 W
Sputtering pressure: 0.2 Pa
Sputtering time: 8 hours
Peak vacuum degree: $4\times10^{-5}$ Pa
Atmosphere gas composition: Ar gas/mixed gas (90 vol % of Ar+10 vol % of O)

TABLE 1

| | | Composition | Impurities | | Special grain boundary length ratio | | Crystal grain diameter | | Sputtering test Number of times of abnormal electrical discharge | |
|---|---|---|---|---|---|---|---|---|---|---|
| | | | Si + C (massppm) | O (massppm) | Average value of $L\sigma_N/L_N$ | Maximum variation (%) | Average crystal grain diameter (μm) | Proportion of area (%)* | Ar gas | Mixed gas |
| Examples of invention | 1 | oxygen-free copper | <1 | 1 | 0.58 | 12 | 59 | 19 | 0 | 1 |
| | 2 | oxygen-free copper | <1 | 2 | 0.63 | 1.3 | 84 | 15 | 0 | 1 |
| | 3 | oxygen-free copper | <1 | 3 | 0.51 | 17 | 103 | 10 | 2 | 1 |
| | 4 | Cu—0.01 mass % Ca | 2 | 47 | 0.67 | 5 | 34 | 8 | 1 | 2 |
| | 5 | Cu—2.0 mass % Mn | 3 | 10 | 0.59 | 10 | 21 | 6 | 5 | 3 |
| | 6 | Cu—0.7 mass % Mg—1.7 mass % Al | 6 | 25 | 0.61 | 15 | 19 | 17 | 2 | 1 |
| Comparative Example | 1 | oxygen-free copper | 1 | 2 | 0.32 | 32 | 131 | 56 | 16 | 19 |
| | 2 | oxygen-free copper | <1 | 1 | 0.58 | 25 | 180 | 74 | 28 | 24 |
| | 3 | Cu—0.63 mass % Ca | 31 | 73 | 0.63 | 15 | 41 | 21 | 42 | 51 |
| | 4 | Cu—2 mass % Mg—5 mass % Al | 9 | 58 | 0.20 | 18 | 51 | 19 | 52 | 85 |
| | 5 | oxygen-free copper | 25 | 1 | 0.61 | 10 | 165 | 105 | 32 | 35 |

*The proportion of the area of the crystal grains having a crystal grain diameter which is more than double the average crystal grain diameter As shown in Table 1, in Comparative Examples 1 to 5, the number of times of an abnormal electrical discharge was counted under any of the conditions of Ar gas and mixed gas in the sputtering test.

With respect to this, in Examples 1 to 6 of the invention, it was confirmed that the number of times of an abnormal electrical discharge was decreased under any of the conditions of Ar gas and mixed gas in the sputtering test and the sputtering can be stably executed.

INDUSTRIAL APPLICABILITY

According to the cylindrical sputtering target material of the invention, consistency of the crystal grain boundaries is improved in the outer peripheral surface which is a sputtering surface, and the entire sputtering surface is uniformly sputtered, and accordingly, it is possible to prevent occurrence of an abnormal electrical discharge, even when sputtering is performed at high power. In addition, according to the cylindrical sputtering target material of the invention, it is possible to prevent an abnormal electrical discharge caused by the impurities and to stably form a film.

REFERENCE SIGNS LIST

10 CYLINDRICAL SPUTTERING TARGET MATERIAL
11 OUTER PERIPHERAL SURFACE

The invention claimed is:

1. A cylindrical sputtering target material formed of copper or a copper alloy,
   wherein, when special grain boundary length ratios $L\sigma_N/L_N$ are defined by a unit total grain boundary length $L_N$ which is obtained by using an EBSD method while measuring a total grain boundary length L of crystal grain boundaries in a measurement range and converting the total grain boundary length L into a value per unit area of 1 mm$^2$ and a unit total special grain boundary length $L\sigma_N$ which is obtained by using the EBSD method while measuring a total special grain boundary length Lσ of special grain boundaries in a measurement range and converting the total special grain boundary length Lσ into a value per unit area of 1 mm$^2$;
   the special grain boundary length ratios $L\sigma_N/LN$ are measured at 12 points of the target including 4 points which are located away in an axis direction from an edge surface of one side of the target material by 20 mm and are located at intervals of 90° in a circumferential direction, 4 points which are located at a center portion in the axis direction and are located at intervals of 90° in the circumferential direction, and 4 points which are located away in the axis direction from an edge surface of the other side of the target material by 20 mm and are located at intervals of 90° in the circumferential direction;
   an average value of the special grain boundary length ratios $L\sigma_N/L_N$ is set to be equal to or greater than 0.5, and each value of special grain boundary length ratios $L\sigma_N/L_N$ is in a range of ±20% with respect to the average value; and
   the cylindrical sputtering target material comprises 90 mass % or more of Cu, a total amount of Si and C which are impurity elements is equal to or greater than 0.01 mass ppm and equal to or smaller than 10 mass ppm and an amount of O is equal to or greater than 0.5 mass ppm and equal to or smaller than 50 mass ppm.

2. The cylindrical sputtering target material according to claim 1,
   wherein an average crystal grain diameter of a crystal structure of the outer peripheral surface is in a range of 10 μm to 150 μm.

3. The cylindrical sputtering target material according to claim 1,
   wherein a proportion of an area of crystal grains having a crystal grain diameter which is more than double an average crystal grain diameter of a crystal structure of the outer peripheral surface is less than 20% of an entire crystal area.

4. The cylindrical sputtering target material according to claim 2,
   wherein a proportion of an area of crystal grains having a crystal grain diameter which is more than double the average crystal grain diameter of the crystal structure of the outer peripheral surface is less than 20% of an entire crystal area.

5. The cylindrical sputtering target material according to claim 1, wherein the following relationships are satisfied:

$$140 \text{ mm} \leq D \leq 180 \text{ mm};$$

$$110 \text{ mm} \leq d \leq 135 \text{ mm; and}$$

$$1000 \text{ mm} \leq L_A \leq 4000 \text{ mm},$$

where D is outer diameter of the cylindrical sputtering target material, d is an inner diameter of the cylindrical sputtering target material, and $L_A$ is a length of the cylindrical sputtering target material in an axis direction.

6. The cylindrical sputtering target material according to claim 1, wherein the target material is first prepared by melting the copper or copper alloy under a temperature equal to or lower than 1200 °C. under a non-oxidizing atmosphere.

* * * * *